Figure 1:
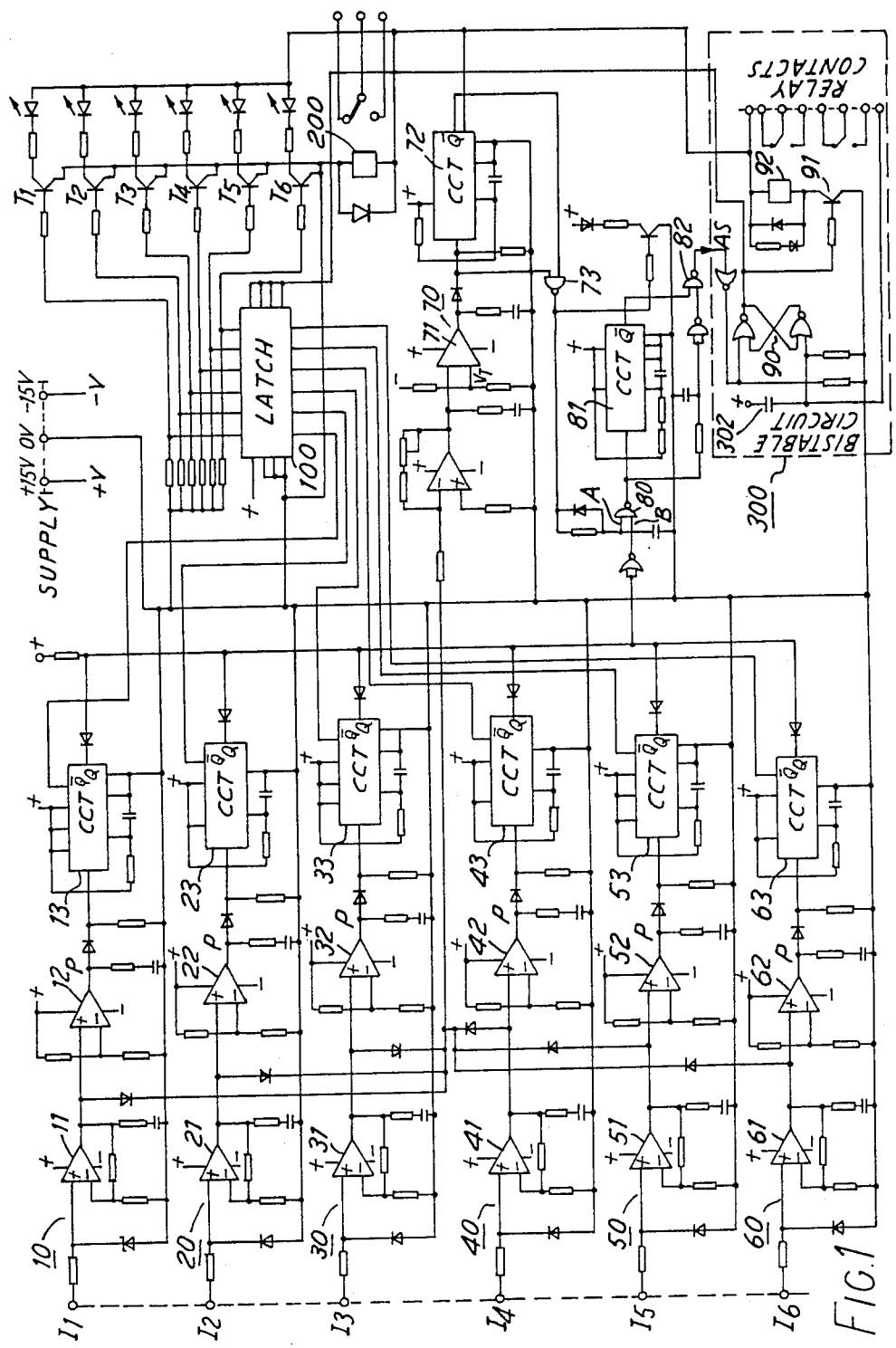

United States Patent [19]

French et al.

[11] Patent Number: 4,713,652
[45] Date of Patent: Dec. 15, 1987

[54] ELECTRICAL APPARATUS

[75] Inventors: Steven J. French, Coventry; David L. Neasham, Penkridge, both of England

[73] Assignee: Thorn Emi Electronics Limited, Hayes, England

[21] Appl. No.: 799,643

[22] Filed: Nov. 19, 1985

[30] Foreign Application Priority Data

Nov. 22, 1984 [GB] United Kingdom ................ 8429487

[51] Int. Cl.⁴ ............................................. G08B 21/00
[52] U.S. Cl. ..................................... 340/652; 340/645; 340/512; 324/500
[58] Field of Search ............... 340/652, 645, 529, 512, 340/309.15, 521, 539; 324/51, 158 D, 119; 328/120

[56] References Cited

U.S. PATENT DOCUMENTS

| | | | |
|---|---|---|---|
| 3,293,605 | 12/1966 | Moore | 340/512 X |
| 3,665,461 | 5/1972 | Gnägi | 340/512 X |
| 3,688,293 | 8/1972 | Sullivan | 340/521 X |
| 3,806,906 | 4/1974 | Young | 340/645 |
| 4,222,037 | 9/1980 | Schaap et al. | 340/309.15 |
| 4,604,607 | 8/1986 | Sanderford, Jr. et al. | 340/539 |

FOREIGN PATENT DOCUMENTS

| | | |
|---|---|---|
| 1347306 | 2/1974 | United Kingdom . |
| 1583244 | 1/1981 | United Kingdom . |
| 2101784 | 1/1983 | United Kingdom . |

Primary Examiner—James L. Rowland
Assistant Examiner—Jeffery A. Hofsass
Attorney, Agent, or Firm—Fleit, Jacobson, Cohn & Price

[57] ABSTRACT

An electrical apparatus for monitoring electrical continuity includes a number of input circuits each associated with a respective arm of a multi-phase rectifier circuit the continuity of which is to be monitored. Each input circuit includes a comparator which generates a train of pulses P while an input current persists in the arm. If a discontinuity arises in an arm for a first preset interval of time a monostable in that arm generates a first trigger signal. If the discontinuity persists for a further preset interval of time another monostable, common to all the arms, triggers an alarm via a bistable circuit.

17 Claims, 8 Drawing Figures

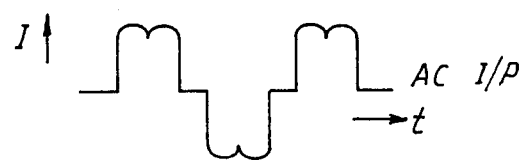
FIG.6a
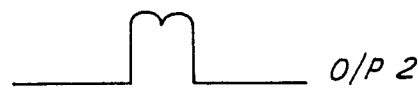
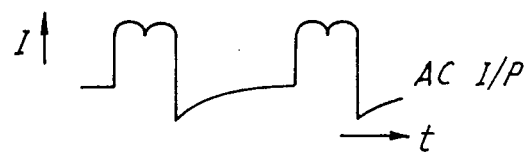
FIG.6b

ELECTRICAL APPARATUS

This invention relates to an electical apparatus suitable for monitoring electrical continuity in an electrical circuit. The invention finds particular, though not exclusive, application in monitoring electrical continuity in an a.c. power supply, and especially in the rectifier circuit associated with a multiphase power supply.

Detection of a discontinuity in the rectifier circuit of a multiphase power supply can be particularly important of an equipment being supplied performs a vital operational function—as in the case of equipment used in signalling or other supervisory systems, for example. A potentially hazardous situation could develop if a discontinuity occurs in one, or only some, of the input arms of the rectifier circuit since, in these circumstances, an associated equipment may continue to function, but its performance may be impaired.

In general, an electrical apparatus used to monitor electrical continuity should be relatively insensitive to transient effects which are of little inherent interest e.g. a temporary interruption in the main supply.

According there is provided an electrical apparatus suitable for monitoring electrical continuity in an electrical circuit, the apparatus comprising means for generating a succession of pulses while an electrical signal prevails in the circuit and means for generating an alarm signal, to indicate an open circuit condition, if an interruption in said succession persists for at least a preset interval of time.

In accordance with a particular embodiment of the invention the electrical apparatus includes a first timing circuit for generating a first electrical signal if said interruption persists at least for a first portion of said interval of time and a second timing signal, responsive to a said first electrical signal, to generate said alarm signal if the interruption persists for the remaining portion of said interval of time. The first and second timing circuits may include monostable circuits which have respective time constants related to said first and remaining portions of said interval of time. In a particular example, said succession of pulses has a periodicity of 20 ms and said first and remaining portions are respectively of 70 ms and 150 ms duration. In these circumstances, the said time interval is 220 ms and so an alarm will be generated if an open circuit condition persists for a minimum of 200 ms.

In one application of the present invention the electrical apparatus is suitable for monitoring electrical continuity in respective input arms of a rectifier circuit. In this case, a respective said pulse generating means and a respective said first timing circuit may be provided to monitor an electrical signal prevailing in each input arm of the rectifier circuit and said second timing circuit is arranged to respond to a said first electrical signal generated by any one of the first timing circuits.

To reduce the possiblity of false alarm if the rectifier circuit is de-energized intentionally, said second electrical circuit can be arranged so as to be capable of generating an alarm signal provided also that the magnitude of an electrical signal in at least one of the input arms exceeds a threshold value.

Respective current sensing means may be provided for connection in each input arm of the rectifier circuit or, alternatively, when space is limited, current sensing means may be provided to sense current in a supply line for respective input arms of the rectifier circuit, the current sensing means including a circuit capable of responding to the positive and negative half cycles of the supply waveform to generate, at different output locations, electrical signals corresponding to the current in said respective input arms.

Figure 2A:
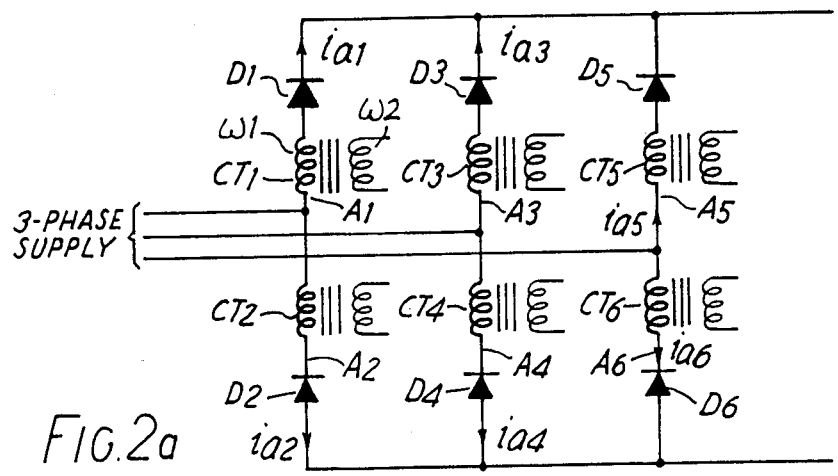
Figure 2B:
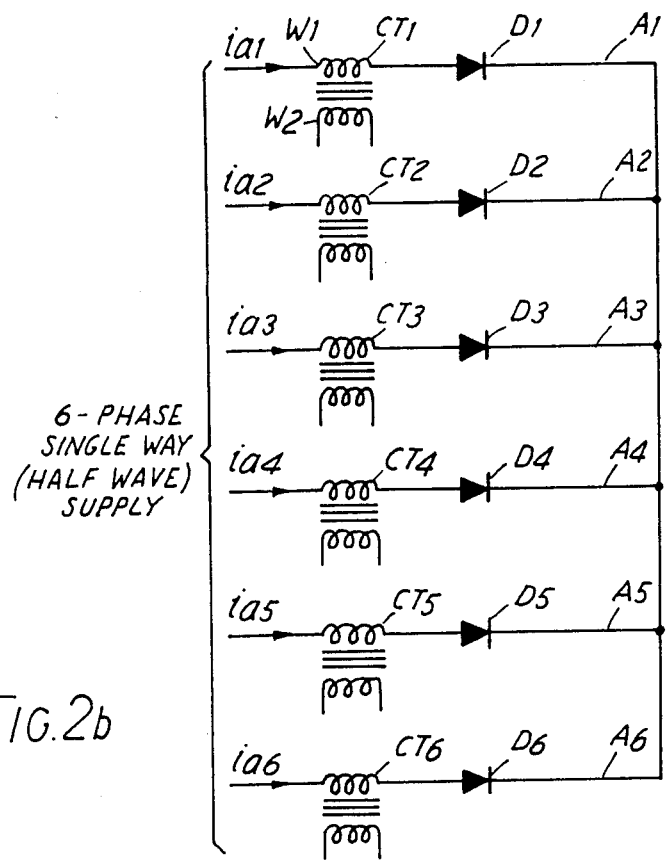
Figure 3:
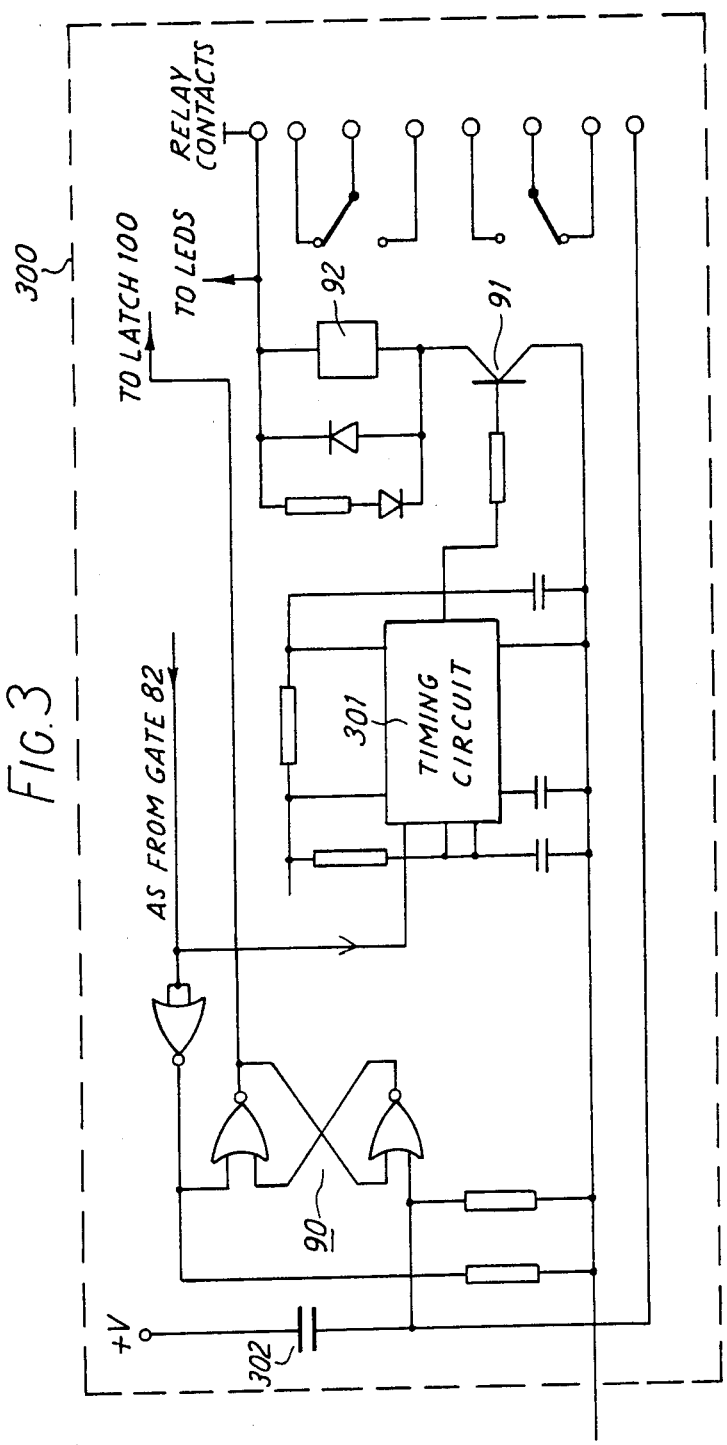
Figure 4:
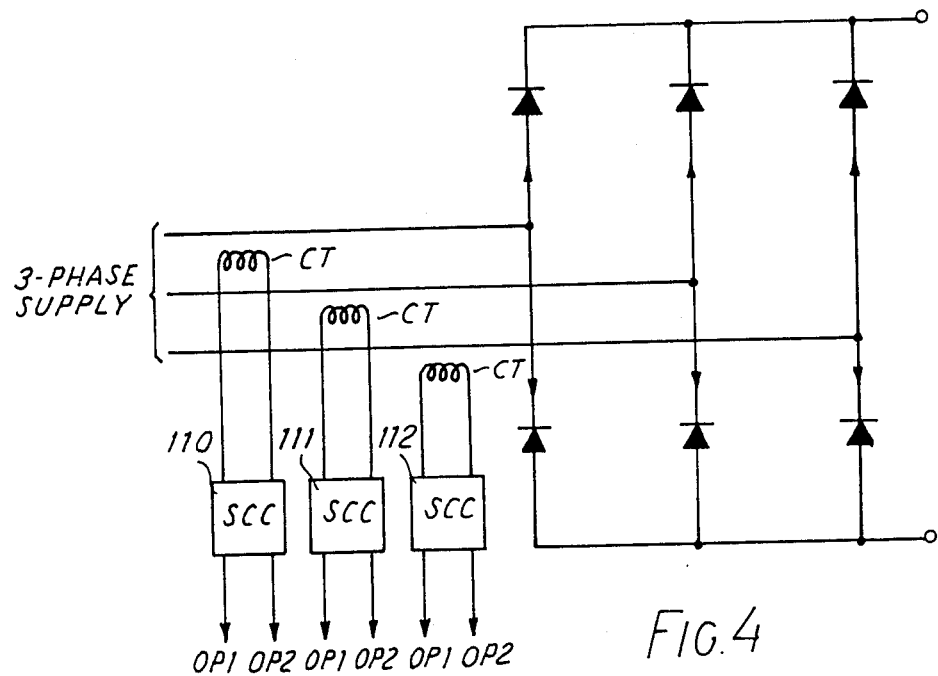
Figure 5:
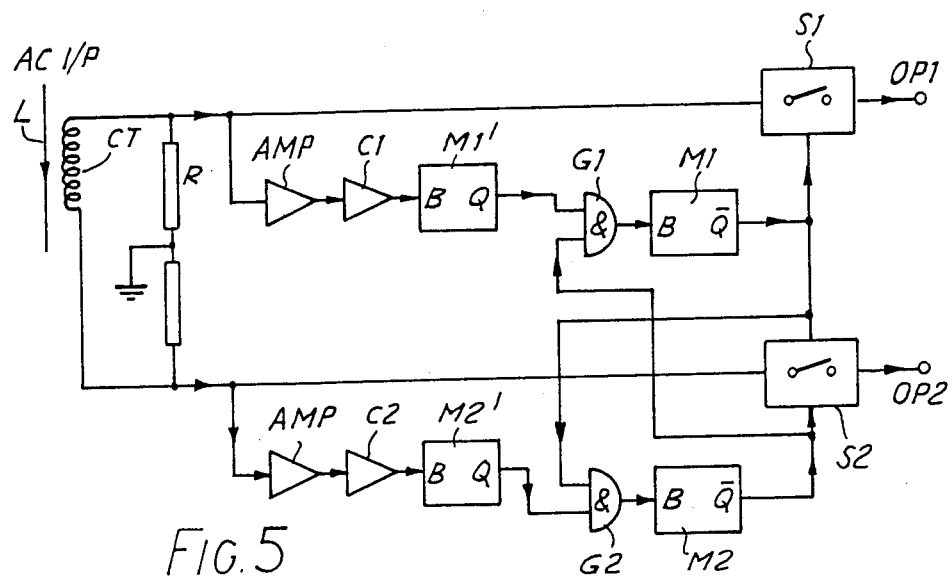

In order that the invention may be carried readily into effect an embodiment thereof is now described, by way of example only, by reference to the accompanying drawings of which:

FIG. 1 shows an electrical apparatus, in accordance with the invention, which is in the form of an open circuit arm detector used to monitor electrical continuity in the rectifier circuit of a multiphase power supply, FIGS. 2a and 2b show alternative configurations of a rectifier circuit, FIG. 3 shows an alternative form of the circuit shown in FIG. 1, FIG. 4 shows an arrangement for sensing current in the supply lines for a rectifier circuit, FIG. 5 shows a signal conditioning circuit used in the arrangement of FIG. 4, and FIGS. 6a and 5b show output waveforms generated by the conditioning circuit of FIG. 5 in response to different input waveforms.

In this example of the present invention an open circuit arm detector, shown in FIG. 1, is used to monitor electrical continuity in respective arms of a rectifier circuit.

The rectifier circuit may be configured, as shown in FIG. 2a, to receive power from a 3-phase supply or alternatively, as shown in FIG. 2b, from a 6-phase, single way (half wave) supply.

The input current $i_{a1} \ldots i_{a6}$ prevailing in each arm $A_1 \ldots A_6$ of the rectifier circuit is monitored by means of a respective current transformer $CT_1 \ldots CT_6$. The primary winding W1 of each transformer is connected in series with a diode $D_1 \ldots D_6$ in a respective arm and a voltage, proportional to the input current in that arm, is developed across the secondary winding W2. The voltages developed in this manner are applied to respective input terminals $I_1 \ldots I_6$ of the detector shown in FIG. 1.

The detector operates on the received voltages and generates an alarm signal if a discontinuity in any one of the input arms persists for longer than a predetermined interval of time. If desired, the alarm signal may be used to de-energize the rectifier circuit thereby to disconnect an associated equipment which might otherwise be damaged or operate in an unreliable or dangerous manner.

Voltages applied at input terminals $I_1 \ldots I_6$ are operated on, initially by respective circuits shown generally at 10, 20 . . . 60. These circuits are identical and only one of them, circuit 10, will be described in detail.

After amplification in a circuit 11, a voltage applied at input terminal $I_1$ of circuit 10 is used to drive a comparator 12. In response, the comparator generates a train of CMOS trigger pulses P which are fed to the input of a monostable circuit 13.

In this example the trigger pulses have a periodicity of 20 ms and the monostable circuit is arranged to have a time constant of 70 ms. In these circumstances circuit 13 assumes the unstable condition if the pulse train is applied continuously at its input. However, if an interruption of more than 70 ms occurs the circuit reverts to the stable condition and its output goes low, indicating that an open circuit condition may have arisen in the associated input arm of the rectifier circuit.

In some operational situations an interruption could arise if the rectifier circuit was de-energize intentionally; this would create an apparent "open circuit" condition in each of the input arms. To eliminate the possibility of a false alarm in these circumstances a further circuit, shown generally at 70, is provided to monitor the magnitudes of voltages applied at input terminals $I_1 \ldots I_6$.

After suitable amplification, the amplitudes of the applied voltages are compared with a threshold voltage $V_T$ in a comparator 71. The threshold voltage is set at a suitable value corresponding to the minimum operating current $i_{min}$ in the input arms of the rectifier circuit. If the applied voltage, associated with any of the input arms, exceeds the threshold voltage $V_T$ comparator 71 generates an output signal which is fed to another monostable circuit 72 whose input and output locations are connected to respective input terminals of a NAND gate 73. With this arrangement a low produced at the output of gate 73 indicates that at least one of the input arms carries the minimum operating current.

The output of gate 73 is coupled to one input terminal A of another NAND gate 80, the other input terminal B being coupled commonly to the outputs of the monostable circuits 13, 23 ... 63 in circuits 10 ... 60. If both inputs to gate 80 are simultaneously low a potential fault detected by one or more circuits 10 ... 60 is likely to be of significance. In these circumstances the output of gate 80 goes high and triggers a yet further monostable circuit 81. The input and output locations of circuit 81 are connected to respective input locations of a further NAND gate 82. In this example, monostable circuit 81 has a time constant of 150 ms; if both inputs to gate 80 remain low for this length of time, thereby indicating that an interruption in the pulse train, detected by one or more of circuits 10 ... 60, has persisted for 220 ms, NAND gate 82 produces an alarm signal AS suitable to cause a change of state in a bistable circuit 90. In response circuit 90 renders a transistor 91 non-conductive thereby causing a relay 92 to de-energise and triggering a number of alarms which may be located at remote monitoring stations. If desired, the relay may also be used to de-energize the rectifier circuit. A signal generated at the output of bistable circuit 90 is also used to trigger a latch circuit 100 connected, as shown, to circuits 10 ... 60 so as to sample, and store data indicative of, the voltage levels prevailing at the inverted outputs of monostable circuits 13 ... 63. The latch, when triggered, drives appropriate ones of a plurality of transistors $T_1 \ldots T_6$ in accordance with the stored data. If an one circuit condition is detected in an input arm of the rectifier circuit the latch drives the corresponding transistor which, in turn, energizes an associated LED (as shown). The LEDS provide a display capable, when energized, of showing the location of any detected fault.

In an alternative arrangement that part of the circuit enclosed by box 300 in FIG. 1 is replaced by a corresponding circuit shown in FIG. 3. In this case, bistable circuit 90 is not used to control transistor 91; instead alarm signal AS triggers a timing circuit 301 directly, which, in turn, de-energizes the transistor, after a preset delay of 1 second, for example. Bistable circuit 90 is used to trigger latch 100 as described hereinbefore. If desired, a capacitor 302 may be used as a "power-on-reset" for the bistable circuit.

If desired, a further relay, shown at 200 in FIG. 1 may be provided which de-energizes if the power supply to the circuit should fail.

In a yet further arrangement, monostable circuit 81 is omitted, circuits 13 ... 63 having correspondingly larger time constants (220 ms, for example), as desired. In these circumstances gate 80 is coupled directly to bistable circuit 90.

It will be appreciated that in some operational situations, especially when space is restricted, it may be inconvenient to provide a current transformer in each arm of the rectifier circuit, as shown in FIGS. 2a and 2b.

As shown in FIG. 4, it may be more convenient instead to provide respective current transformers (CT) on each input cable of the power supply. In this case half wave signals corresponding to each phase of the supply are generated at different output locations OP1, OP2 of respective signal conditioning circuits 110, 111, 112, each of the form shown in FIG. 5.

Referring to FIG. 5, the current sensed by a transformer CT, located close to the supply line, is routed to output locations OP1, OP2 via respective solid state switching circuits S1, S2. The switching circuits are controlled by respective monostable circuits M1, M2 which are triggered by respective AND gates G1, G2. One input terminal of each gate is connected to a further monostable circuit M1', M2' which is driven by pulses generated in a comparator C1, C2 and derived from the positive and negative half cycles of the sensed current. The other input terminal of each gate G1, G2 is cross-coupled, as shown, to the output of one of the monostable circuits M1, M2 in such a way that the switches S1, S2 can never assume the same state. In this manner the positive and negative half cycles of the a.c. input current are presented independently at the respective output locations OP1, OP2 for supply to respective input terminals of an associated continuity monitoring apparatus.

FIGS. 6a and 6b show the output waveforms generated at OP1 and OP2 in response to different a.c. input waveforms.

The circuit of FIG. 5 proves to be particularly beneficial in that the open circuit arm detector of FIG. 1 may be used even in circumstances when it is impracticable or inconvenient to locate current transformers in the input arm of a rectifier circuit.

It will be appreciated that although the above-described examples involve using current transformers, alternative forms of current sensing devices could be employed. For example, a Hall effect current transducer could be mounted on each input line to the rectifier circuit and interfaced with a detection circuit of the kind described, for example, by reference to FIGS. 1 or 3. Each transducer would generate current outputs proportional to the forward and reverse currents flowing in the line.

It will be appreciated that although the above-described examples have been presented in the context of three-phase or a six-phase, single-way supply the present invention is applicable to other forms of supply e.g. a single phase supply.

Moreover, it will be understood that the present invention can be applied to other forms of an electrical circuit, whether or not used for the supply of power, in which it is desirable to monitor electrical continuity.

What is claimed is:

1. An electrical apparatus suitable for monitoring electrical continuity of the input arms of a rectifier circuit, the apparatus comprising a plurality of pulse generating means, each being associated with a respective input arm of the rectifier circuit and generating a succession of electrical pulses while an electrical signal prevails in said input arm, and a plurality of first timing circuits, each being associated with a respective input arm of the rectifier circuit and generating a respective first electrical signal provided an interruption of a respective succession of electrical pulses persists for a first part of a preset interval of time, and a second timing circuit, being responsive to a said first electrical signal generated by any of said plurality of first timing circuits, to initiate an alarm signal provided said interruption persists for the remainder of said preset interval of time.

2. An electrical apparatus according to claim 1 wherein each of said first timing circuits includes a respective first monostable circuit and said second timing circuit includes a second monostable circuit, said first and second monostable circuits having time constants which are related to said first and remaining parts respectively of said preset interval of time.

3. An electrical apparatus according to claim 2 wherein said second timing circuit is capable of generating an alarm signal provided also that the magnitude of a said electrical signal in at least one of the input arms exceeds a threshold value.

4. An electrical apparatus according to claim 3 wherein each said current sensing means includes a circuit responsive to the positive and negative half cycles of a supply wave form and generating, at different output locations, respective electrical signals related to the current in the respective arm of the rectifier circuit.

5. An electrical apparatus according to claim 4 suitable for monitoring electrical continuity of the input arms of a rectifier circuit connected to a multiphase power supply, the apparatus including a plurality of said current sensing means, each being associated with a respective phase of the multiphase supply.

6. An electrical apparatus according to claim 3 including a respective current sensing means for coupling to each input arm of the rectifier circuit.

7. An electrical apparatus according to claim 2 including a respective current sensing means for coupling to each input arm of the rectifier circuit.

8. An electrical apparatus according to claim 7 wherein each said current sensing means includes a circuit responsive to the positive and negative half cycles of a supply wave form and generating, at different output locations, respective electrical signals related to the current in the respective arm of the rectifier circuit.

9. An electrical apparatus according to claim 8 suitable for monitoring electrical continuity of the input arms of a rectifier circuit connected to a multiphase power supply, the apparatus including a plurality of said current sensing means, each being associated with a respective phase of the multiphase supply.

10. An electrical apparatus according to claim 1 including a respective current sensing means for coupling to each input arm of the rectifier circuit.

11. An electrical apparatus according to claim 10 wherein each said current sensing means includes a circuit responsive to the positive and negative half cycles of a supply wave form and generating, at different output location, respective electrical signals related to the current in the respective arm of the rectifier circuit.

12. An electrical apparatus according to claim 11 suitable for monitoring electrical continuity of the input arms of a rectifier circuit connected to a multiphase power supply, the apparatus including a plurality of said current sensing means, each being associated with a respective phase of the multiphase supply.

13. An electrical apparatus according to claim 1 wherein said second timing circuit is capable of generating an alarm signal provided also that the magnitude of a said electrical signal in at least one of the input arms exceeds a threshold value.

14. An electrical apparatus according to 13 including a respective current sensing means for coupling to each input arm of the rectifier circuit.

15. An electrical apparatus according to claim 14 wherein each said current sensing means includes a circuit responsive to the positive and negative half cycles of a supply wave form and generating, at different output locations, respective electrical signals related to the current in the respective arm of the rectifier circuit.

16. An electrical apparatus according to claim 15 suitable for monitoring electrical continuity of the input arms of a rectifier circuit connected to a multiphase power supply, the apparatus including a plurality of said current sensing means, each being associated with a respective phase of the multiphase supply.

17. A power supply including a rectifier circuit and an electrical apparatus for monitoring electrical continuity of the input arms of the rectifier circuit, wherein said electrical apparatus comprises a plurality of pulse generating means, each being associated with a respective input arm of the rectifier circuit and generating a succession of electrical pulses while an electrical signal prevails in said input arm, a plurality of first timing circuits, each being associated with a respective input arm of the rectifier circuit and generating a respective first electrical signal provided an interruption of a respective succession of electrical pulses persists for a first part of a preset interval of time, and a second timing circuit, being responsive to a said first electrical signal generated by any of said plurality of first timing circuits, to initiate an alarm signal provided, said interrruption persists for the remainder of said preset interval of time.

* * * * *